(12) United States Patent
Winandy et al.

(10) Patent No.: US 7,948,146 B2
(45) Date of Patent: May 24, 2011

(54) CLIP

(75) Inventors: Jean-Pierre Winandy, Arlon (BE); Christophe Lafon, Veigne (FR)

(73) Assignee: Delphi Technologies Holding S.arl, Troy, MI (US)

( * ) Notice: Subject to any disclaimer, the term of this patent is extended or adjusted under 35 U.S.C. 154(b) by 128 days.

(21) Appl. No.: 12/362,600

(22) Filed: Jan. 30, 2009

(65) Prior Publication Data

US 2009/0206701 A1 Aug. 20, 2009

(30) Foreign Application Priority Data

Jan. 30, 2008 (EP) .................................... 08250365

(51) Int. Cl.
*H01L 41/00* (2006.01)
*A44B 19/00* (2006.01)

(52) U.S. Cl. ............................ 310/311; 310/348; 24/455

(58) Field of Classification Search .................. 310/311, 310/348; 24/455
See application file for complete search history.

(56) References Cited

U.S. PATENT DOCUMENTS

| 6,038,119 A * | 3/2000 | Atkins et al. .................. 361/127 |
| 2008/0246369 A1 * | 10/2008 | Sandford et al. .............. 310/326 |
| 2008/0307616 A1 * | 12/2008 | Graham et al. ................. 24/455 |

FOREIGN PATENT DOCUMENTS

| DE | 10 2005 024710 | 12/2006 |
| DE | 10 2006 026932 | 12/2007 |
| EP | 1 783 842 | 5/2007 |
| IT | EP 0 131 874 A1 * | 7/1984 |

OTHER PUBLICATIONS

EP Search Report Dated Aug. 7, 2008.

* cited by examiner

*Primary Examiner* — Thomas M Dougherty
(74) *Attorney, Agent, or Firm* — Thomas N. Twomey

(57) ABSTRACT

A clip for securing a sleeve to the body of a piezoelectric actuator in an actuator assembly, the clip taking the form of a band comprising first and second axially spaced ring-like members joined by a plurality of inwardly facing substantially arch shaped sections, the arch shaped sections defining the minimum inner diameter of the band, whereby axial displacement of the ring-like members way from one another causes flexing of the arch shaped sections to increase the minimum inner diameter of the band while axial displacement of the ring-like members towards one another causes flexing of the arch shaped sections to reduce the minimum inner diameter of the band thereby, when in use, to increase a clamping force applied to the sleeve.

11 Claims, 7 Drawing Sheets

CLIP

BACKGROUND

The present invention relates to a clip for sealing the ends of a sleeve located around a piezoelectric actuator to the body of that piezoelectric actuator.

In a fuel injector a piezoelectric actuator may be located in an accumulator volume which receives high pressure fuel. It is essential to prevent contact between the fuel and the actuator to prevent the actuator from suffering damage. To prevent such damage it is known to provide a sleeve 2 around the actuator 1. This sleeve 2 must be sealed to the actuator 1 at each end to prevent the ingress of fuel and any contaminants that it may contain.

It is known to provide a metallic sealing ring 3 around the end of the sleeve 2 to seal the end of the actuator 1. Such an arrangement is described in DE102005024710 and DE102006026932 and shown in FIG. 1. However, such known arrangement is expensive and difficult to install and is very temperature dependent, relying on the use of expensive alloys to avoid differential thermal expansion between the actuator and the sealing ring.

SUMMARY

A clip for securing a sleeve to the body of a piezoelectric actuator in an actuator assembly, takes the form of a band comprising first and second axially spaced ring-like members joined by a plurality of inwardly facing substantially arch shaped sections, the arch shaped sections defining the minimum inner diameter of the band, whereby axial displacement of the ring-like members away from one another causes flexing of the arch shaped sections to increase the minimum inner diameter of the band while axial displacement of the ring-like members towards one another causes flexing of the arch shaped sections to reduce the minimum inner diameter of the band thereby, when in use, to increase a clamping force applied to the sleeve.

An actuator assembly comprises a clip as described above, an actuator and a sleeve, which overlaps at least part of the body of the actuator, wherein at the location where the sleeve overlaps the body of the actuator the minimum separation of the external walls of the sleeve is greater than the minimum diameter of the clip, when the clip is in an unstressed state, such that when the clip is fitted over the sleeve the clip applies a clamping force to the sleeve in order to create a seal between the sleeve and the body of the actuator.

BRIEF DESCRIPTION OF THE DRAWINGS

Features and advantages of embodiments of the present invention will become apparent by reference to the following detailed description and drawings, in which like reference numerals correspond to similar, though perhaps not identical components. Reference numerals having a previously described function may or may not necessarily be described in connection with other drawings in which they appear.

DETAILED DESCRIPTION

Figure 1:
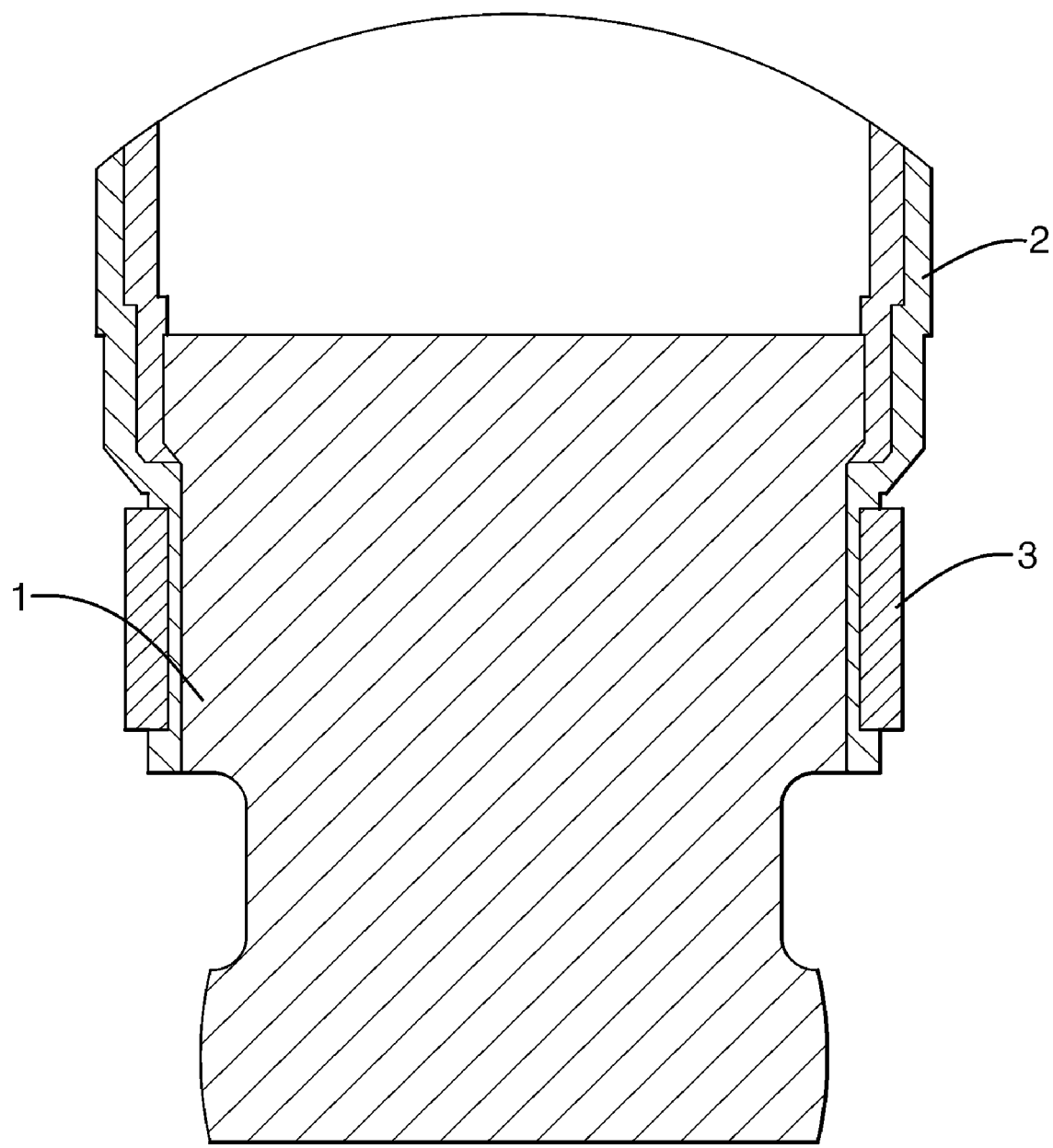
FIG. 1 is a section through a known arrangement of a piezoelectric actuator.
Figure 2:
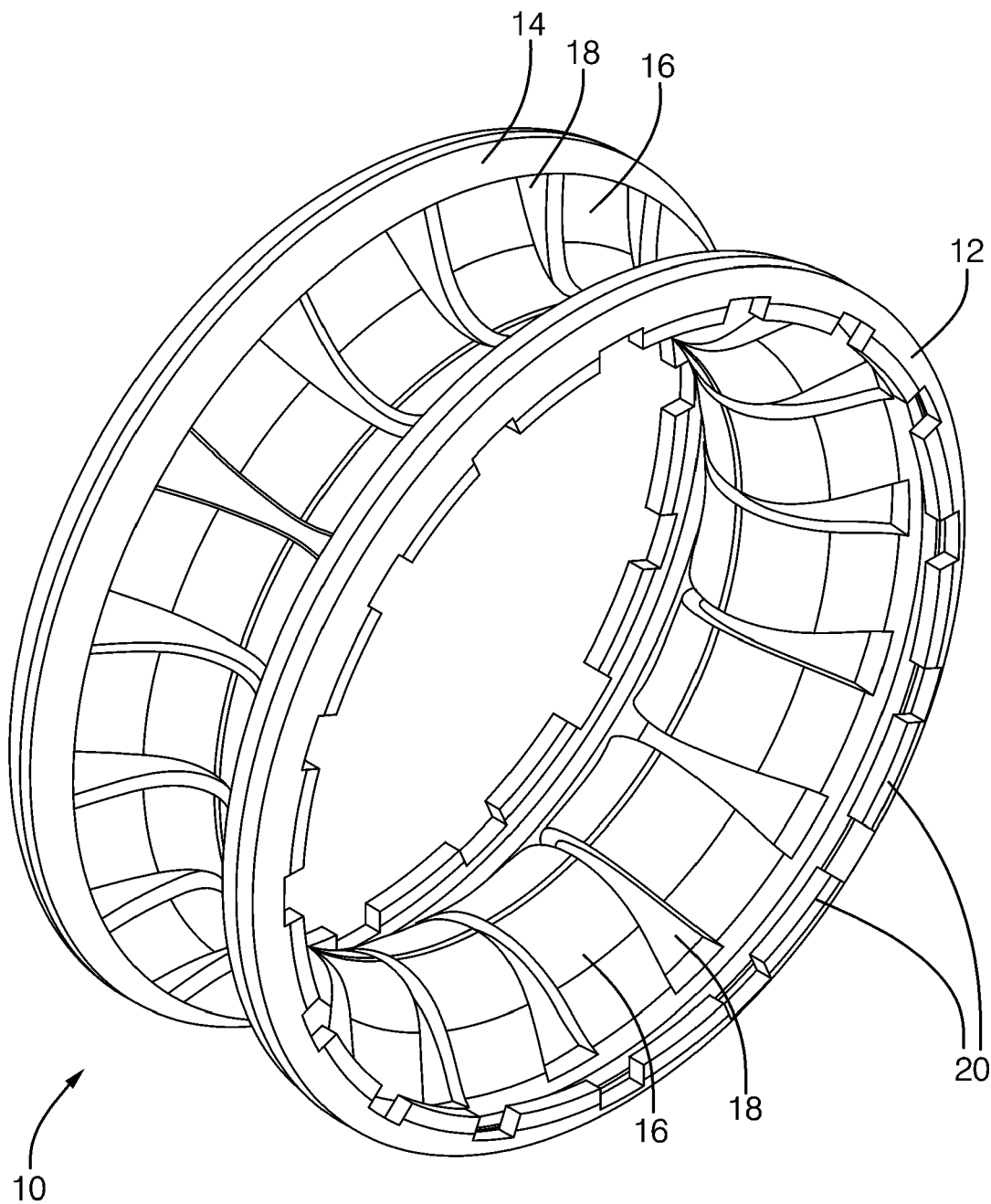
FIG. 2 is a perspective view of a clip according to a first embodiment of the present invention.

As illustrated in FIG. 2, a clip for securing a sleeve to the body of a piezoelectric actuator in an actuator assembly is in the form of a single piece band 10 made from spring steel, the band defining first and second axially spaced continuous circular rings 12,14 joined by a plurality of circumferentially inwardly facing substantially arch shaped sections 16, the rings 12,14 defining the outer diameter of the clip and the arch shaped sections 16 defining the minimum inner diameter of the band 10.

Figure 3A:
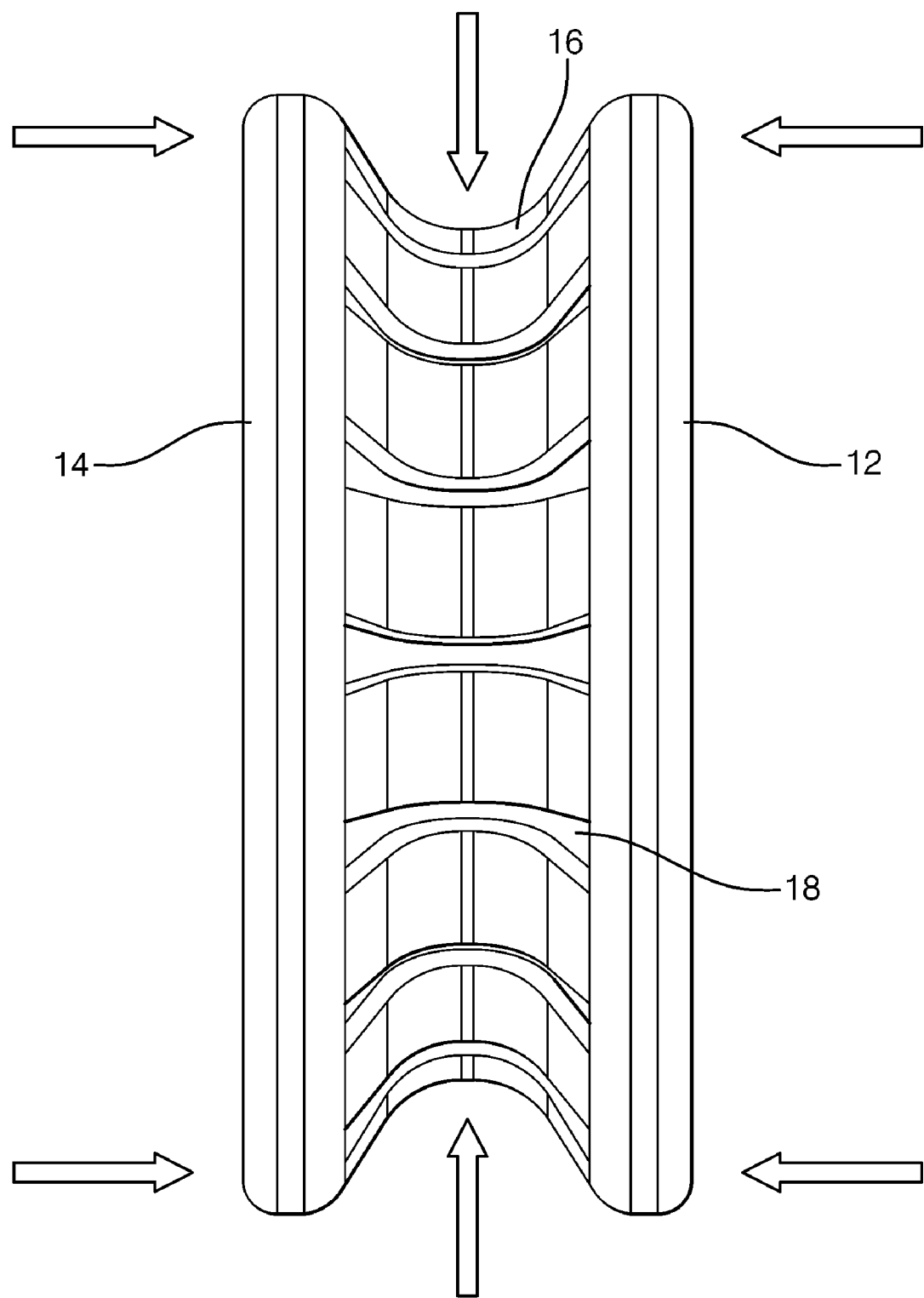
FIG. 3a is a side view of the clip of FIG. 2 showing movement of the ring under axial compression.
Figure 3B:
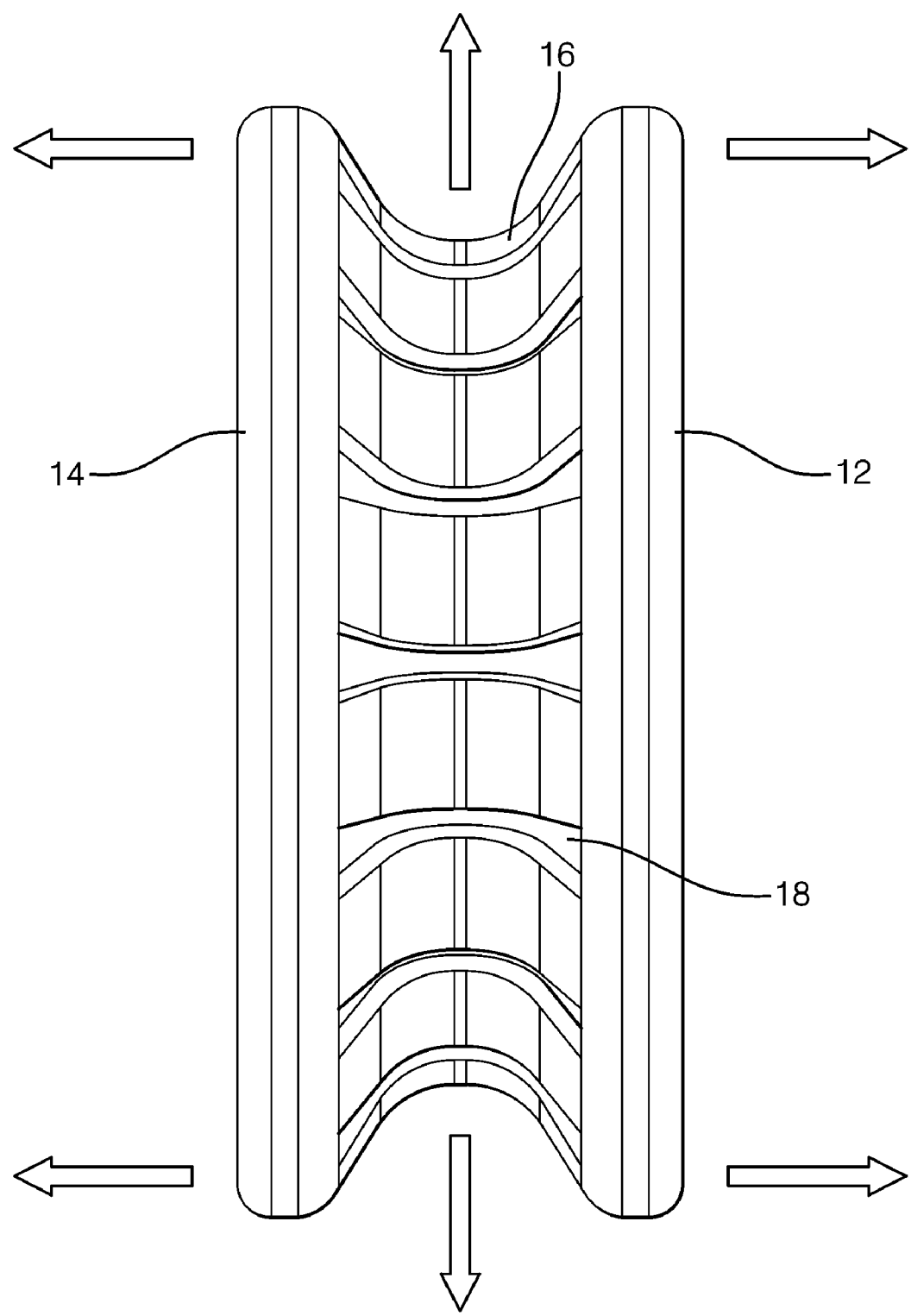
FIG. 3b is a side view of the clip of FIG. 2 showing movement of the ring under axial expansion.

As illustrated in FIG. 3, axial displacement of the rings 12,14 away from one another causes flexing of the arch shaped sections 16 to increase the minimum inner diameter of the band 10, while axial displacement of the rings 12,14 towards one another causes flexing of the arch shaped sections 16 to reduce the minimum inner diameter of the band.

The arch shaped sections 16 of the band 10 are defined by axially extending slots 18 extending between the rings 12,14 and between adjacent arch shaped sections 16.

To allow a tool to grip each ring of the band to pull the rings away from each other to reduce the inner diameter of the clip to enable fitting over the sleeve, or other article to be clamped or sealed, radially inwardly facing projections 20 are formed around the outermost edge of each side of the band 10 at evenly spaced locations around the circumference of each ring 12,14.

Figure 4:
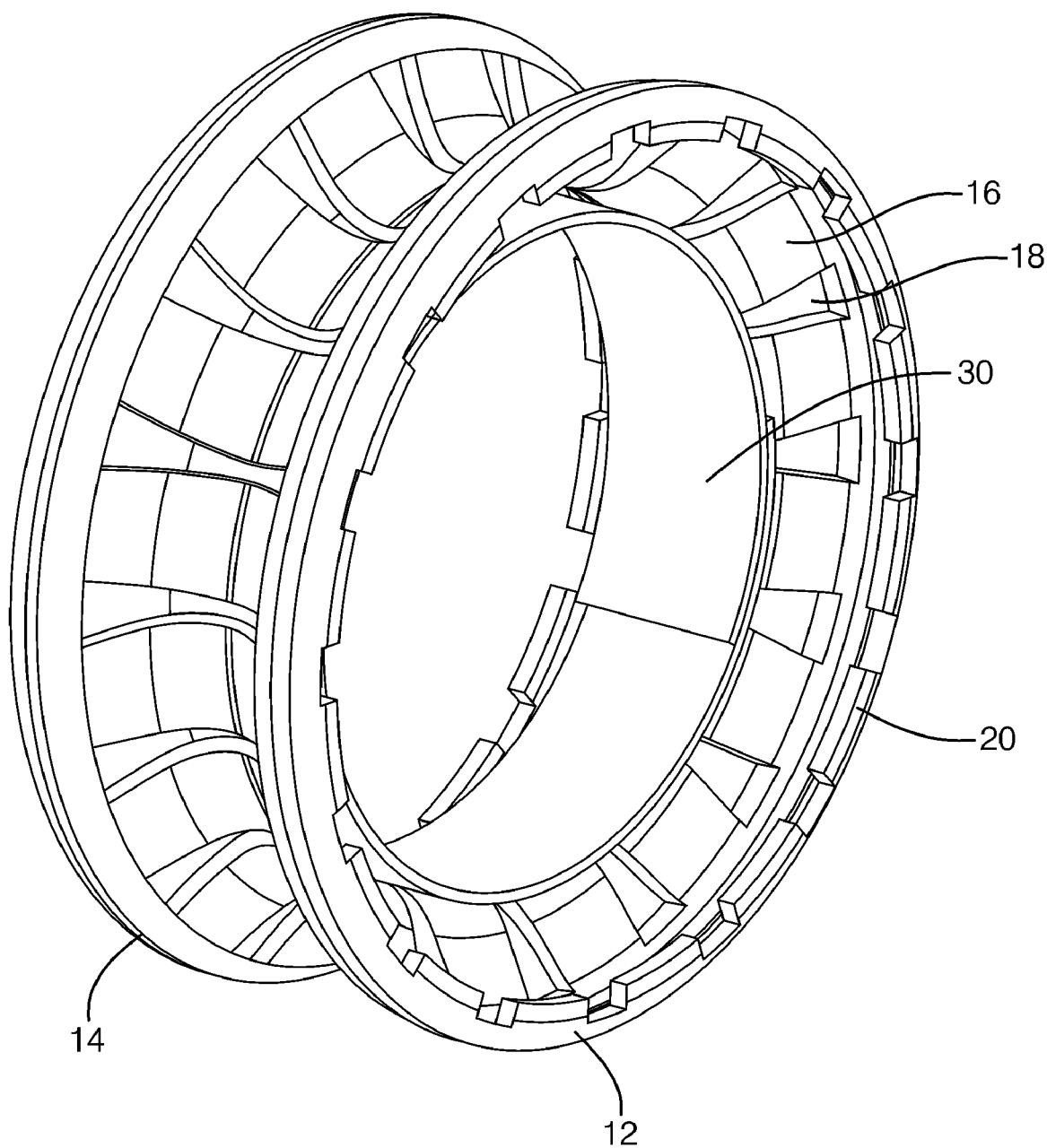
FIG. 4 is a perspective view of a clip according to a second embodiment of the present invention.

In an alternative embodiment of the present invention, illustrated in FIG. 4, a protective strip 30 is wrapped around the region of the sleeve to be clamping such that the strip 30 lies beneath the clip, in use. This avoids any risk of pinching of the sleeve due to the gaps 18 between the arch shaped sections 16. The strip 30 may be formed from a metal, polymer or rubber selected to transmit the load for the clip onto the sleeve therebeneath.

In use, the two rings 12,14 of the band 10 are gripped by a suitable tool and pulled apart to reduce the minimum diameter of the band 10 to allow the band to be readily slid over the sleeve and end of the actuator over which the end of the sleeve is located. Once in position, the rings are released and the resilience of the arch shaped sections pulls the rings 12,14 back together and causes the minimum inner diameter of the band 10 to constrict to providing a radial clamping force around the end of the sleeve to seal the sleeve over the end of the actuator.

Figure 5:
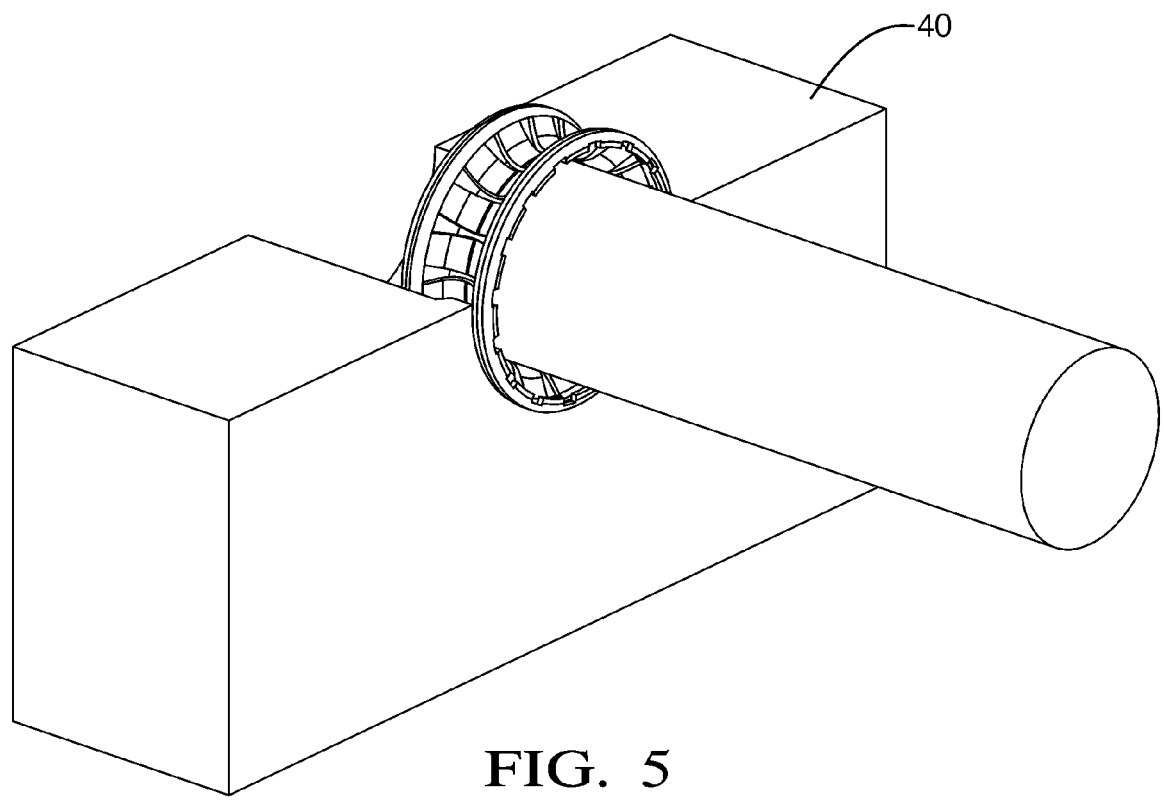
FIG. 5 is a perspective view of the clip of FIG. 2 showing a tool to enable fitting of the clip over a sleeve.
Figure 6:
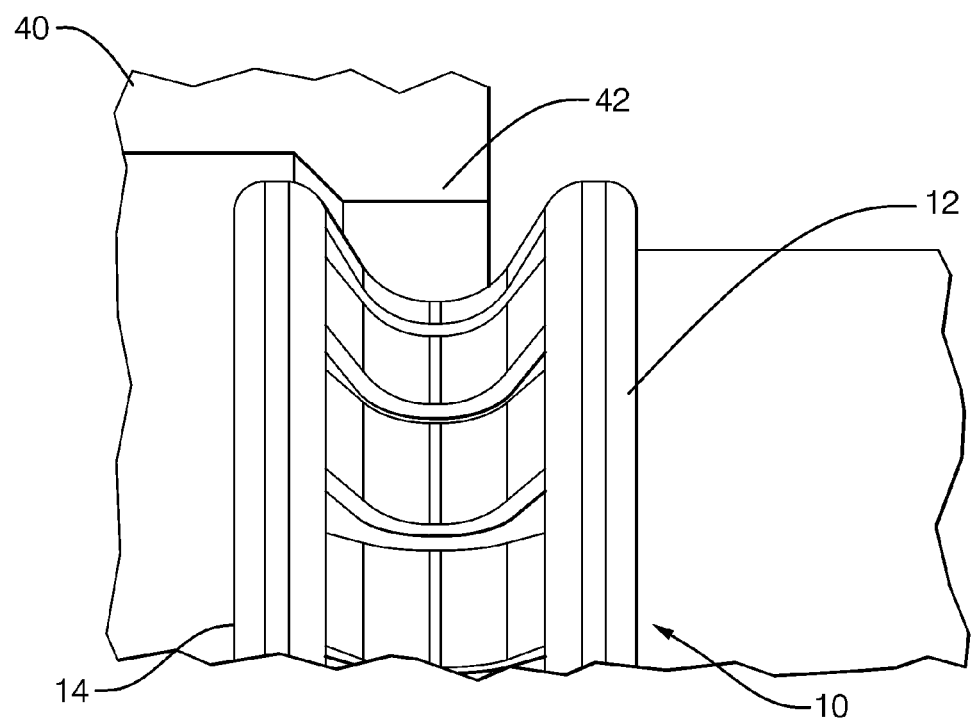
FIG. 6 is a detailed view of part of one part of the tool of FIG. 5.
Figure 7:
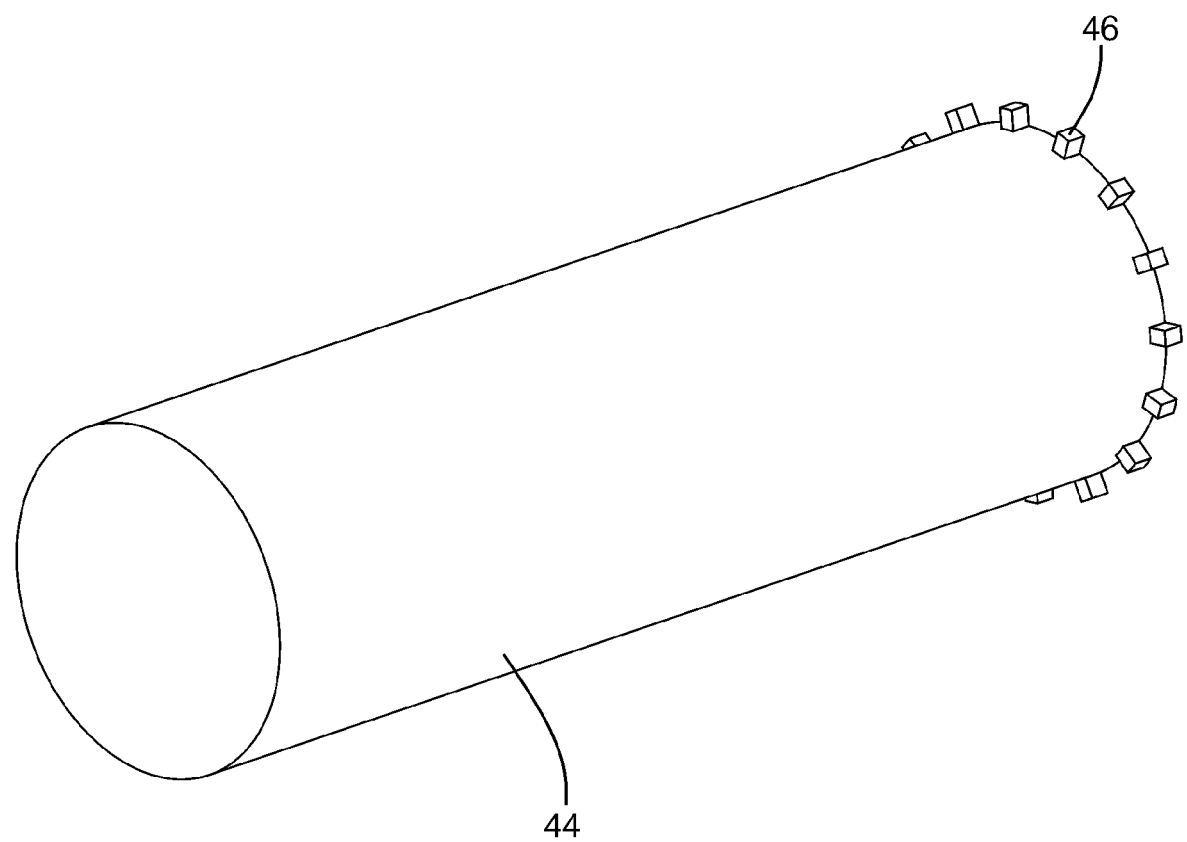
FIG. 7 is a detailed view of a second part of the tool of FIG. 5.

An example of a suitable tool is shown in FIGS. 5 to 7. One of the rings 12,14 of the band 10 is gripped between two half rings 40 each having an inwardly facing lip 42 extending into the space between the rings 12,14. A second part of the tool comprises a cylinder 44 with radially extending teeth 46 than are dimensioned to engage into the clip between the inwardly facing projections 20 of one side of the clip and be locked in place behind the projections 20 by rotation of the inserted cylinder, whereby the inner diameter of the clip can be expanded by pulling the cylinder 44 away from the half rings 40 to pull the two rings 12,14 of the band 10 apart.

If a greater sealing force is required, an axial loading can be placed on the band 10 to urge the rings 12,14 of the band towards one another.

While the clip according to the present invention has been described in relation to the sealing of a sleeve over the end of a piezoelectric actuator, it is envisaged that the clip may be used wherever a radial clamping or sealing force is required, for example as a hose clip, pipe connection, or a cable joint.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiments.

The invention claimed is:

1. A clip for securing a sleeve to the body of a piezoelectric actuator in an actuator assembly, the clip taking the form of a band comprising first and second axially spaced contiguous ring-like members joined by a plurality of inwardly facing substantially arch shaped sections, the arch shaped sections defining the minimum inner diameter of the band, whereby axial displacement of the ring-like members away from one another causes flexing of the arch shaped sections to increase the minimum inner diameter of the band while axial displacement of the ring-like members towards one another causes flexing of the arch shaped sections to reduce the minimum inner diameter of the band thereby, when in use, to increase a clamping force applied to the sleeve;
wherein each of the ring-like members is provided with engagement means for engagement with a tool to permit displacement of the ring-like members away from each other.

2. A clip as claimed in claim 1, wherein the band is circular.

3. A clip as claimed in claim 2, wherein the arch shaped sections are evenly circumferentially spaced between the ring-like members.

4. A clip as claimed in claim 1, wherein the ring-like members and the arch shaped sections are integrally formed from a single material, the arch shaped sections being defined by cut-out regions, apertures or slots extending between the ring-like members and between adjacent arch shaped sections.

5. A clip as claimed in claim 1 made from a resilient material.

6. A clip as claimed in claim 5 made from spring steel.

7. A clip as claimed in claim 1, wherein the engagement means comprise radially extending projections for engagement by corresponding projections provided on a suitable tool in the manner of a bayonet fastening.

8. A clip as claimed in claim 7, wherein the radially extending projections extend inwardly from the inner surface of each ring-like member.

9. A clip for securing a sleeve to the body of a piezoelectric actuator in an actuator assembly, the clip taking the form of a band comprising first and second axially spaced ring-like members joined by a plurality of inwardly facing substantially arch shaped sections, each of the ring-like members being provided with engagement means for engagement with a tool to permit displacement of the ring-like members away from each other, the arch shaped sections defining the minimum inner diameter of the band, whereby axial displacement of the ring-like members away from one another causes flexing of the arch shaped sections to increase the minimum inner diameter of the band while axial displacement of the ring-like members towards one another causes flexing of the arch shaped sections to reduce the minimum inner diameter of the band thereby, when in use, to increase a clamping force applied to the sleeve.

10. A clip as claimed in claim 9, wherein the engagement means comprise radially extending projections for engagement by corresponding projections provided on a suitable tool in the manner of a bayonet fastening.

11. A clip as claimed in claim 10, wherein the radially extending projections extend inwardly from the inner surface of each ring-like member.

* * * * *